(12) United States Patent
Pellizzer

(10) Patent No.: US 9,460,784 B1
(45) Date of Patent: Oct. 4, 2016

(54) REFERENCE VOLTAGE GENERATION APPARATUSES AND METHODS

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/693,275

(22) Filed: Apr. 22, 2015

(51) Int. Cl.
G11C 11/00 (2006.01)
G11C 13/00 (2006.01)

(52) U.S. Cl.
CPC ....... *G11C 13/0038* (2013.01); *G11C 13/0004* (2013.01); *G11C 13/004* (2013.01); *G11C 13/0023* (2013.01); *G11C 2013/0054* (2013.01)

(58) Field of Classification Search
CPC .......... G11C 13/0004; G11C 13/0069; G11C 11/5678
USPC ................ 365/163, 189.06, 185.17, 189.09, 365/185.24
See application file for complete search history.

(56) References Cited

U.S. PATENT DOCUMENTS

| | | | | |
|---|---|---|---|---|
| 5,572,474 A * | 11/1996 | Sheen | ............. | G11C 7/062 365/194 |
| 5,638,322 A * | 6/1997 | Lacey | ............. | G11C 7/062 365/185.2 |
| 6,982,908 B2 * | 1/2006 | Cho | ............. | G11C 11/16 365/158 |
| 2004/0223392 A1* | 11/2004 | Ikehashi | ............. | G11C 7/06 365/205 |
| 2011/0080775 A1* | 4/2011 | Bae | ............. | G11C 7/04 365/163 |
| 2014/0003124 A1* | 1/2014 | Youn | ............. | G11C 13/004 365/148 |
| 2015/0221365 A1* | 8/2015 | Park | ............. | G11C 13/004 365/163 |

\* cited by examiner

*Primary Examiner* — Connie Yoha
(74) *Attorney, Agent, or Firm* — Schwegman Lundberg & Woessner, P.A.

(57) ABSTRACT

A method and apparatuses for generating a reference voltage are disclosed. One example apparatus includes a current source coupled to a first power supply. The current source supplies a first current. A reference memory cell is coupled to the current source at a reference node. The reference memory cell has a select device comprising a chalcogenic semiconductor material. A clamp circuit is coupled between the reference memory cell and a second power supply. The clamp circuit is configured to control a second current such that when the first current and second current are substantially equal, the reference voltage generated at the reference node tracks a threshold voltage of the select device.

21 Claims, 6 Drawing Sheets

REFERENCE VOLTAGE GENERATION APPARATUSES AND METHODS

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., phase change memory, flash) memory.

Non-volatile memories are useful elements of integrated circuits due to their ability to maintain data after removal of a power supply. Phase change materials have been investigated for use in non-volatile memory cells. Phase change memory (PCM) elements include phase change materials, such as chalcogenic semiconductor materials (e.g., chalcogenide alloys), that are capable of stably transitioning between amorphous and crystalline phases. Each phase exhibits a particular resistance state that distinguishes the logic values of the memory element. Specifically, an amorphous state exhibits a relatively high resistance and a crystalline state exhibits a relatively low resistance. One of different logic levels (e.g., logic 1 or logic 0) can be assigned to each of these states. In the chalcogenides, the resistivity may vary by two or more orders of magnitude when the material passes from the amorphous (more resistive) phase to the crystalline (more conductive) phase, and vice versa.

In one embodiment, each memory cell typically includes both a phase change memory element (PM) connected in series with a select device (SD). The SD may be a switching element that includes a diode, a transistor, or an ovonic threshold switch (OTS). Also, the OTS is constructed with a chalcogenic material (i.e., it is an alloy containing at least one chalcogenic element). The OTS begins to conduct when a voltage above a threshold voltage $V_{th}$ is applied across the switch.

The threshold voltage $V_{th}$ of the OTS is subject to drift over time. The threshold voltage drift may be harmful for OTS-selected memory arrays since it may prevent the storage element of chalcogenic material from being correctly read. For example, if the threshold voltage $V_{th}$ of the selector is not known with satisfactory precision and the chalcogenic storage element is crystalline (e.g., stores a logic "1"), the memory cell may be read as a logic "0" since, at the reading voltage, the switch has not yet transitioned to the conductive state.

DETAILED DESCRIPTION

To address some of the challenges of threshold voltage drift, as well as others, apparatus, systems, and methods are described herein that may track cross-point memory cell threshold voltage based on a chalcogenide select device. Examples of such embodiments are now described in detail.

Figure 1:
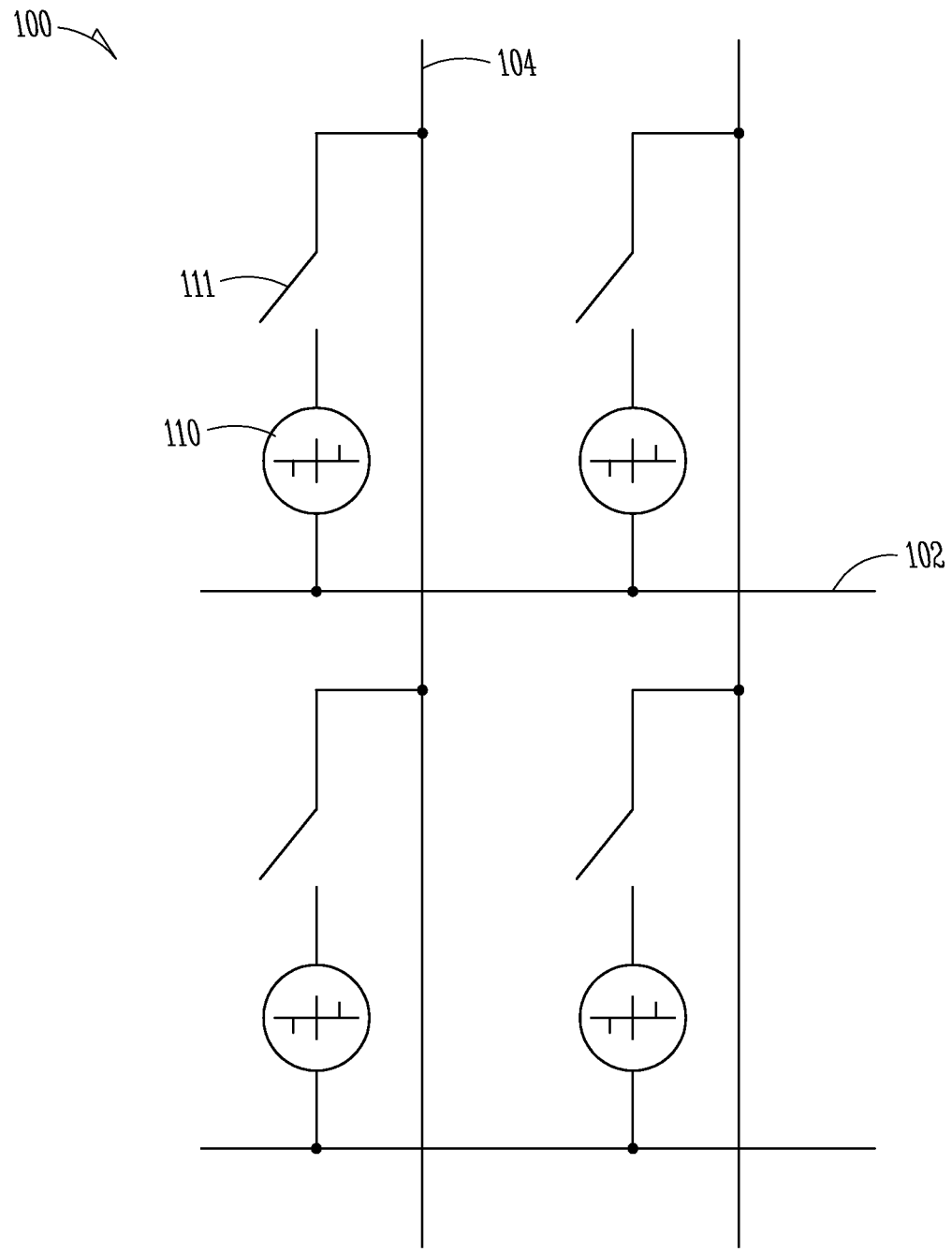
FIG. 1 shows the architecture of a memory array according to an embodiment of the present invention.

FIG. 1 shows the architecture of a memory array according to an embodiment of the present invention. A plurality of memory cells 100 are arranged in rows and columns to form the array. The memory array may be referred to as a cross-point memory array since the memory cells 100 are interposed at cross-points between rows 102 (i.e., word lines) and columns 104 (i.e., bit lines) of the array. The memory cells 100 may include variable resistance memory cells as well as other types of memory cell technology.

Figure 2:
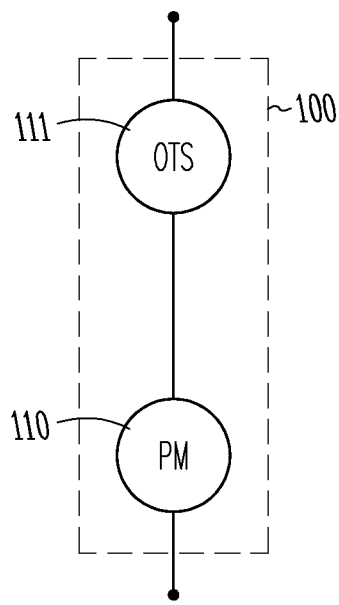
FIG. 2 shows the electrical equivalent of a memory cell having a threshold switch according to an embodiment of the present invention.

Each memory cell 100 includes a memory element 110 coupled in series with, and adjacent to, a select device 111 represented as a switch. FIG. 2 shows the electrical equivalent of a memory cell 100 (PM) having an ovonic threshold switch 111 (OTS) according to an embodiment of the present invention. The connection order of the memory element 110 (PM) and the select device (SD) 111 is for purposes of illustration only and may be reversed in another embodiment.

The memory element 110 (PM) may include any variable-resistance memory element such as a memory element constructed of chalcogenic semiconductor materials having at least two distinct metastable phases (e.g., crystalline and amorphous). The memory element 110 is the data storage device of the memory cell 100. If the memory element 110 is a PCM, its amorphous, high resistivity state may be referred to as a "reset" state while the crystalline, low resistivity state may be referred to as a "set" state.

The variable resistance material at the heart of a memory element 110 does not usually function as a linear resistor (unless it is in its fully crystallized state). Instead, the current passed by a variable resistance material will depend exponentially on the applied voltage. Accuracy in the read voltage (i.e. the voltage precharged onto the bit line before the select device is turned on) is therefore important in obtaining an accurate read operation.

The select device 111 may be any type of switch that turns on to conduct current when a voltage across the switch is equal to or greater than a threshold voltage $V_{th}$. For example, the select device 111 may comprise a chalcogenic semiconductor material fixed in a single phase (generally amorphous) with two distinct regions of operation associated with different resistivities (e.g., ovonic threshold switch).

Referring again to FIG. 1, a terminal of the select device 111 of each memory cell 100 is coupled to a respective bit line 104. A terminal of the memory element 110 of each memory cell is coupled to a respective word line 102. A memory array may be broken down into sub-elements such as tiles where a tile may comprise a group of memory cells.

Figure 3:
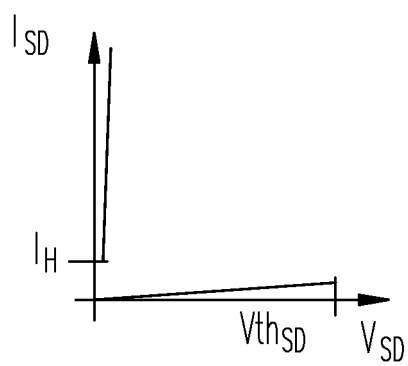
FIG. 3 shows a plot of current versus voltage characteristics for a threshold switch according to an embodiment of the present invention.

FIG. 3 shows a plot of current versus voltage characteristics for a threshold switch in a memory cell according to an embodiment of the present invention. The y-axis represents the threshold switch current $I_{SD}$ while the x-axis represents the threshold switch voltage $V_{SD}$.

Figure 4:
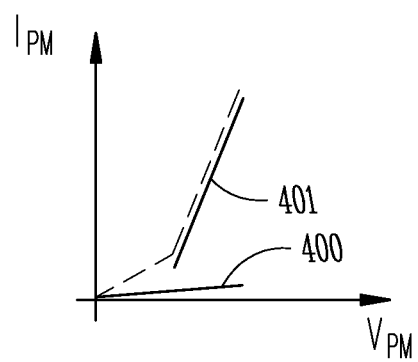
FIG. 4 shows a plot of current versus voltage for a variable resistance memory element according to an embodiment of the present invention.

It can be seen in FIG. 3 that the threshold switch has a high resistance for voltages below the threshold voltage $V_{th,SD}$. When the applied voltage is equal to or exceeds the threshold voltage $V_{th,SD}$, the switch begins to conduct at a substantially constant, low voltage and has a low impedance. In this condition, if the memory element is in the set state, as seen in FIG. 4, the memory cell is turned on. If the memory element is in the reset state, the memory cell remains off.

When the current $I_{SD}$ falls below a hold current $I_H$, the threshold switch returns to the high-impedance state. This behavior is symmetrical and also occurs when negative voltages are applied, and negative currents flow (not shown).

FIG. 4 shows a plot of current versus voltage for a variable resistance memory element according to an embodiment of the present invention. The y-axis represents the memory element current $I_{PM}$ while the x-axis represents the memory element voltage $V_{PM}$.

The plot 400 of the amorphous state (i.e., reset state) of a variable resistance memory element is similar to the plot of the threshold switch performance as seen in FIG. 3. The plot 401 of the crystalline state (i.e., set state) shows that the memory element has a lower conductance in the lower portion of the plot and a higher conductance in the upper portion.

The problem associated with the threshold voltage ($V_{th}$) drift of the select device may be solved in many instances by using a circuit having a reference memory cell (or cells) to detect and store the threshold voltage $V_{th}$ of a cross-point memory cell based on the behavior of a chalcogenide select device. The reference memory cell(s) may provide a reference voltage for reading a plurality of memory cells.

Figure 5:
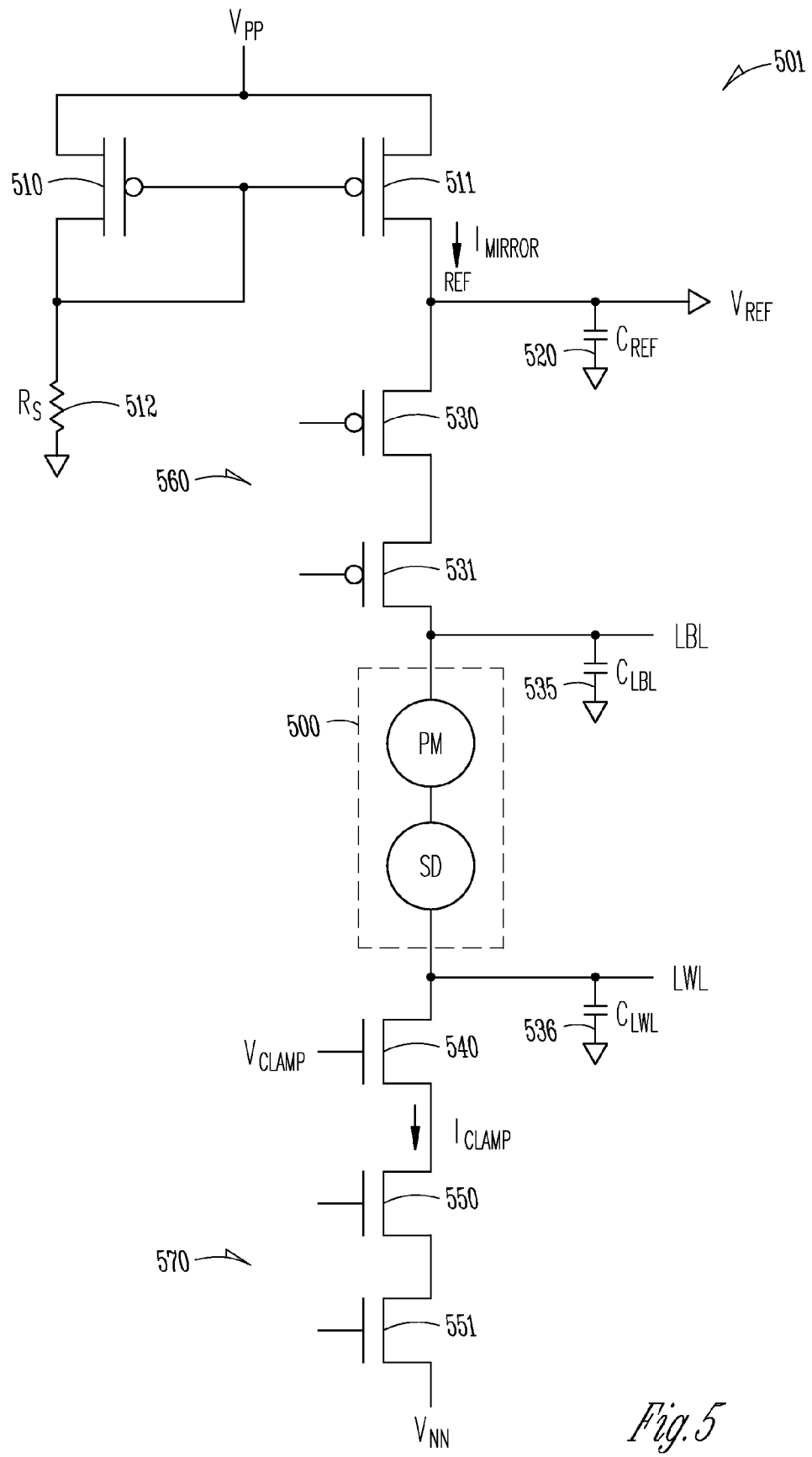
FIG. 5 shows an electrical schematic diagram of a reference voltage generation apparatus to track threshold voltage shift in a memory cell according to an embodiment of the present invention.

FIG. 5 shows an electrical schematic diagram of a reference voltage generation apparatus to track threshold voltage shift in a memory cell according to an embodiment of the present invention. The circuit uses a reference memory cell 500 that stores the threshold voltage. In an embodiment, the reference memory cell 500 is fabricated so as to be located relatively close to the memory cell or group of memory cells for which it operates as the associated reference memory cell.

The circuit of FIG. 5 generates a reference voltage $V_{REF}$ at the reference node that tracks the threshold voltage of a memory cell (or cells) (e.g., select device) as the threshold voltage shifts over time. The reference voltage $V_{REF}$ tracks the natural drift of $V_{th}$ for chalcogenide select devices and may be generated in a relatively short time (e.g., <10 nanoseconds (ns)) that is compatible with a desired latency of storage class memories (approximately 100 ns). This is accomplished in the illustrated embodiment by using a PCM memory element in a set (i.e., crystallized) state as the reference cell.

The reference voltage circuit includes a current source 501 that generates current $I_{MIRROR}$. The illustrated embodiment uses a current mirror circuit comprising a pair of transistors 510, 511 (e.g., p-type metal oxide semiconductor field effect transistors (MOSFETs)) coupled together at their control gates and their sources coupled to a first power supply that supplies positive supply voltage $V_{PP}$. The current mirror circuit 501 further comprises a resistance $R_S$ 512 coupled between one of the transistors 510 and ground. In some embodiments, other current mirror source circuit configurations are used.

The current source 501 is coupled to a pair of series-connected transistors 530, 531 (e.g., p-type MOSFETs) in the $I_{MIRROR}$ path. These transistors 530, 531 represent the bit line (sometimes referred to as a data line) decoding circuitry (i.e., column decoder) 560 for the memory cells to which the reference voltage circuit is coupled. The transistors 530, 531 representing the bit line decoding circuitry 560 are for purposes of illustration only as there may be other quantities of memory cells to which the reference voltage circuit is coupled and, thus, the number of decoding path transistors 530, 531 may be different.

In an embodiment, one reference cell may be used for each set of bits (e.g., the number of bits that form a word) that are written or read substantially simultaneously. For example, if 128 bits are read across 128 tiles in order to build one word (i.e., one bit per tile is read), one tile of reference cells may be used for every 128 tiles in order to track the threshold voltage $V_{th}$ for the bits included in each single word.

The reference node REF between the current source 501 and the pair of series-connected transistors 530, 531 provides the $V_{REF}$ voltage. The capacitance $C_{REF}$ 520 may represent a capacitance of an input node of an operational amplifier, of a bit line decoding path, configured as a buffer with unity gain. The capacitance $C_{REF}$ 520 may also represent an extra capacitance specifically added to the circuit for the purpose of maintaining the $V_{REF}$ voltage for a particular time during a read operation. In an embodiment, the $C_{REF}$ 520 has a capacitance of approximately 400 femtofarads (fF).

The reference memory cell 500 is coupled to one of the series-connected transistors 531 at a local bit line node LBL. The capacitance of the local bit lines that are coupled to the reference voltage circuit of FIG. 4 may be represented by the capacitance $C_{LBL}$ 535. In an embodiment, $C_{LBL}$ 535 has a capacitance of approximately 40 fF.

The reference memory cell 500 is coupled to a clamp circuit 540 at a local word line (sometimes known to those of ordinary skill in the art as a word line) node LWL. The capacitance of the local word lines that are coupled to the reference voltage circuit of FIG. 4 may be represented by the capacitance $C_{LWL}$ 436. In an embodiment, $C_{LWL}$ 536 has a capacitance of approximately 40 fF. $C_{LWL}$ 436 is the capacitance that is equalized when the reference cell 500 reaches its threshold voltage.

The clamp circuit 540 is represented by an n-channel MOSFET 540 with a control gate biased at $V_{CLAMP}$. The clamp circuit 540 is coupled between the reference memory cell 500 and a second power supply that supplies a supply voltage $V_{NN}$ that is less than the $V_{PP}$ voltage. As discussed subsequently, one or more access line (row) decoder circuits 570 may be coupled between the clamp circuit 540 and the second power supply represented by $V_{NN}$. The access line decoder circuit 570 is represented by transistors 550, 551. In an embodiment, the first power supply may supply a positive voltage while the second power supply may supply a negative voltage. In another embodiment, the first power supply may supply a positive voltage while the second power supply may supply a relatively low voltage (e.g., 0 V).

The clamp circuit 540, in saturation, is configured to keep the LWL node at a relatively low voltage $V_{NN}$ while controlling a current $I_{CLAMP}$. The clamp circuit 540 controls (i.e., maintains) the current $I_{CLAMP}$ at a fixed current while the source current $I_{MIRROR}$ increases. The source current $I_{MIRROR}$ is substantially equal to the current $I_{CLAMP}$ after the transitory response of the reference voltage generation circuit is complete. The MOSFET clamp circuit 540 is for purposes of illustration only as other circuitry may be used to form a clamp circuit. For example, the clamp circuit may be integrated into the architecture of the current mirror circuit 501 in order to minimize the difference between the two currents. The clamp circuit 540 may be physically located as close as possible to the reference cell 500 in order to reduce $C_{LWL}$.

The clamp circuit 540 is coupled between the local word line node LWL and a pair of series-connected transistors 550, 551. The transistors 550, 551 represent the access line decoding circuitry (i.e., row decoder) of memory cells coupled to the reference voltage circuit. The transistors 550, 551 representing the access line decoding circuitry are for purposes of illustration only as there may be other quantities of memory cells to which the circuit is coupled thus using a different quantity of transistors. The row decoding path transistors 550, 551 are coupled to the relatively low voltage $V_{NN}$.

Figure 6:
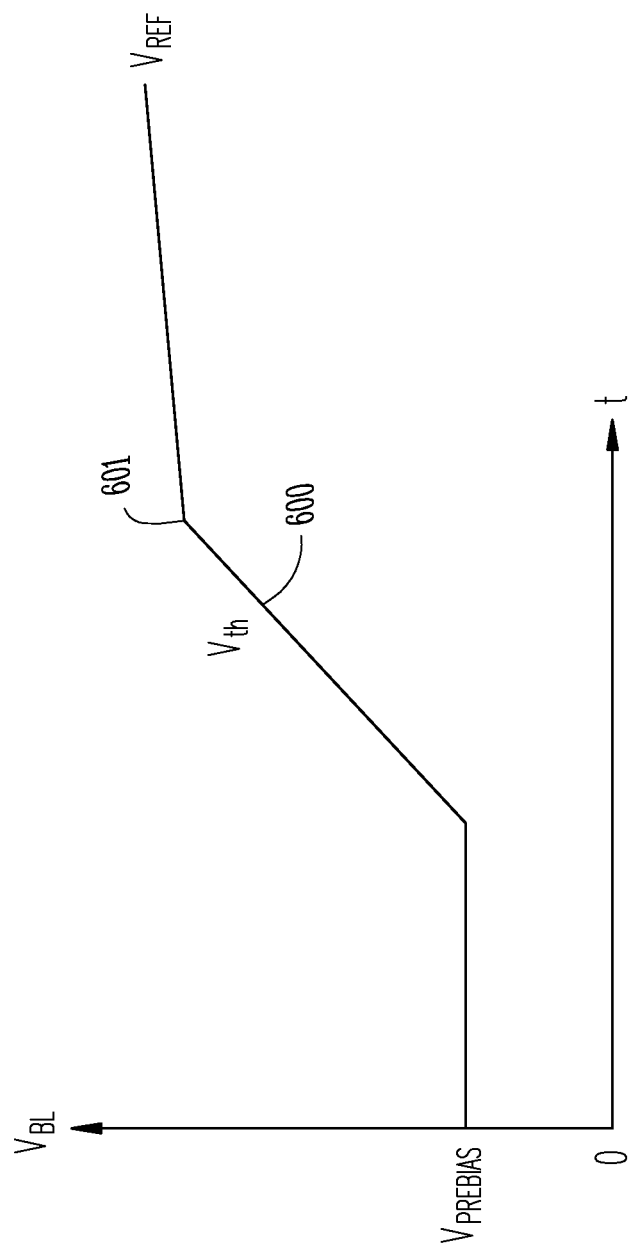
FIG. 6 shows a plot of bit line voltage versus time of a reference node voltage according to an embodiment of the present invention.

In describing the operation of the reference voltage circuit of FIG. 5, reference is made to the plot of FIG. 6. FIG. 6 shows a plot of bit line voltage $V_{BL}$ versus time t of a reference node voltage according to an embodiment of the present invention. The operation of the reference voltage circuit of FIG. 5 is subsequently described as part of a memory operation such as a read operation. This description is for purposes of illustration only as other memory operations using a reference voltage may be executed using the circuit of FIG. 5.

Prior to coupling the current source 501 to the reference memory cell 500, through the bit line decoder circuit 530, 531, the word line node LWL is stabilized at $V_{NN}$ and the bit line node LBL (with the reference node REF) is pre-charged to a pre-bias voltage $V_{prebias}$. The pre-bias voltage $V_{prebias}$ may be a voltage that is close to the minimum switching voltage of the reference memory cell 500 (i.e., SD threshold voltage $V_{th}$) but without risking reaching that threshold voltage $V_{th}$ during normal operations. In an embodiment, the pre-bias voltage $V_{prebias}$ may be approximately 3-5V greater than $V_{NN}$ and approximately 1-2V less than $V_{th}$ of the reference memory cell 500. The pre-bias voltage $V_{prebias}$ may be regulated as a function of the integrated circuit temperature. By starting the bit line at a voltage level approximately equal to $V_{prebias}$, the circuit is able to reduce the time to ramp the bit line node LBL and reference node REF to the reference voltage $V_{REF}$.

After pre-charging the bit line and stabilizing the LWL voltage, the current source 501 current $I_{MIRROR}$ is coupled to the bit line node LBL and reference node REF. This initiates the ramped voltage plot of FIG. 6. It can be seen that in this case the ramped voltage begins at the $V_{prebias}$ voltage and not 0V.

The current source 501 may provide an $I_{MIRROR}$ current that results in a ratio of $\Delta V/\Delta t$ that is substantially equal to $I_{MIRROR}/(C_{REF}+C_{LBL})$. For example, this may result in a 0.2V/ns ramped voltage if $I_{MIRROR}=100$ µA and $C_{REF}+C_{LBL}=500$ fF.

When the ramped voltage reaches the reference cell threshold voltage $V_{th}$ 600, the word line node LWL ramps up and tends to equalize toward the voltage reached by the bit line reference node REF. Due to charge sharing, the LBL and REF node voltage may be reduced (e.g., 10% down from stable $V_{REF}$). However, partial compensation of the charge sharing loss occurs (e.g., by an amount of approximately 0.2V) resulting in an addition to the ramp up value of the REF node voltage. Additional compensation for the charge sharing voltage loss may be performed (e.g., by the amplifier circuit) during delivery of the actual reference voltage to the sensing circuitry (not shown) during a sense (e.g., read) operation.

When the word line node LWL and bit line node LBL stabilize 601 as seen in FIG. 6, the movement of the reference voltage $V_{REF}$ will slow down since $I_{MIRROR}$ and $I_{CLAMP}$ are substantially identical. The closer these currents are to being identical, the more stable the reference voltage matching. The reference memory cell 500 remains in the "on" state during the memory operation in order to maintain equilibrium ($I_{MIRROR}$ is above the typical holding current for the select device SD) and track the reference voltage drift during a memory operation. $V_{REF}$ is now ready to be delivered to the sensing circuit for use during the memory operation.

Figure 7:
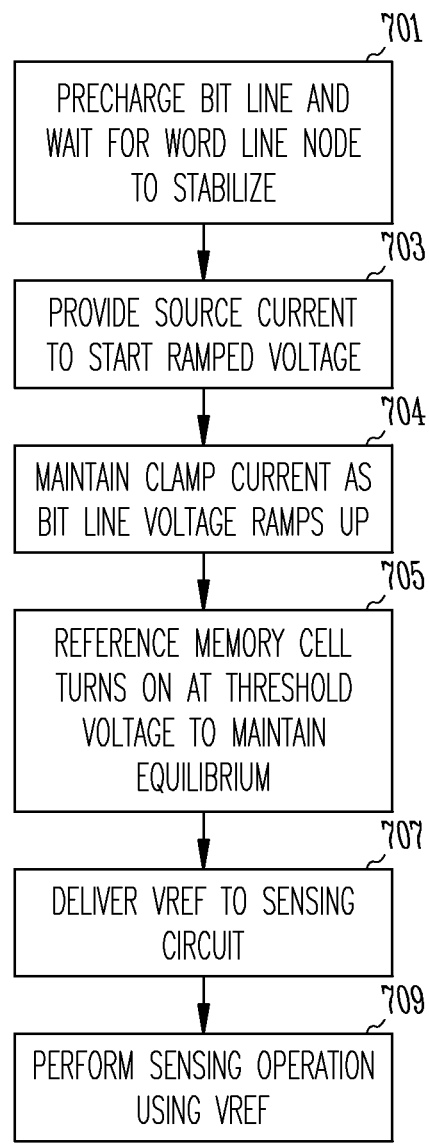
FIG. 7 shows a flowchart of a method for performing a memory operation according to an embodiment of the present invention.

FIG. 7 illustrates a flowchart of a method for performing a memory operation according to an embodiment of the present invention. In block 701, the bit line is pre-charged to a pre-bias voltage $V_{prebias}$ that is greater than $V_{NN}$ but less than $V_{th}$ of the reference memory cell. The word line node LWL is allowed to stabilize at this voltage. A stabilized word line node LWL may be defined as the voltage not changing by more than approximately 0.2-0.4V.

In block 703, a source current $I_{MIRROR}$ is provided to the circuit to start the ramped bit line voltage (starting at $V_{prebias}$). In block 704, the clamp current is maintained by the clamp circuit as the bit line voltage ramps up. In block 705, the reference memory cell turns on when the ramped bit line voltage $V_{BL}$ reaches the memory cell's threshold voltage $V_{th}$. The bit line voltage $V_{BL}$ continues to ramp up until the current from the current source $I_{MIRROR}$ is substantially the same as the clamp current $I_{CLAMP}$ that was maintained by the clamp circuit. The memory cell, in the "on" state, maintains equilibrium of the source current and the clamp current to cause the reference voltage to track the threshold voltage of the select device. This provides a stable $V_{REF}$ after the transitory response of the circuit. The reference voltage $V_{REF}$ may now be delivered to the sensing circuit in block 707. In block 709, a sensing operation may be performed using the generated reference voltage $V_{REF}$. As described previously, the reference voltage $V_{REF}$ may be adjusted by compensating for charge sharing loss during delivery of the voltage. This may be accomplished with an amplifier circuit or some other mechanism.

Figure 8:
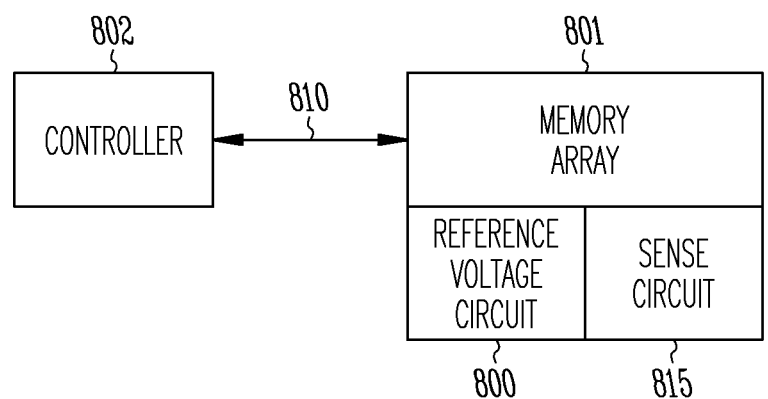
FIG. 8 shows a block diagram of a system according to an embodiment of the present invention.

FIG. 8 shows a block diagram of a system according to an embodiment of the present invention. The block diagram is for purposes of illustration for one possible implementation of the reference voltage circuit of FIG. 5. Other embodiments may use different systems.

The system includes a controller 802. The controller 802 may include any control circuitry, such as a processor or state machine, that is configured to control memory operations of a memory device. For example, the controller 802 may be configured to control generation of voltages and control signals used in the reference voltage circuit of FIG. 5.

A memory array 801, including one or more of the reference voltage circuits 800 of FIG. 5, comprises a plurality of memory cells. The memory cells may include one or more different memory technologies such as PCM or flash. The memory array 801 further includes one or more sense circuits (e.g., sense amplifiers) coupled to the reference voltage circuit(s) 800 to receive the reference voltage as discussed previously.

The memory array 801 may be coupled to the controller 802 over a bus 810. The bus 810 may include addresses lines, data lines, and/or control lines to enable communication between the memory array 801 and the controller 802.

The controller 802 and memory array 801 may be part of a memory device such that both the controller 802 and the memory array 801 are part of the same integrated circuit. In another embodiment, the memory array 801 may be on a separate integrated circuit from the controller 802.

For the purposes of this document, an apparatus may be defined as circuitry, an integrated circuit die, a device, or a system.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A reference voltage generation apparatus comprising:
   a current source coupled to a first power supply and configured to supply a first current;
   a reference memory cell coupled to the current source at a reference node, the reference memory cell having a select device comprising a chalcogenic semiconductor material; and
   a clamp circuit coupled between the reference memory cell and a second power supply, the clamp circuit configured to maintain a second current such that when the first current and second current are substantially equal, the reference voltage generated at the reference node tracks a threshold voltage of the select device.

2. The apparatus of claim 1, wherein the first power supply is configured to generate a first voltage and the second power supply is configured to generate a second voltage that is less than the first voltage, and
   wherein the reference memory cell is coupled between the reference node and the clamp circuit.

3. The apparatus of claim 1, wherein the reference memory cell further comprises a phase change material memory element that is in a crystallized state.

4. The apparatus of claim 1, further comprising a reference capacitance coupled to a node between the current source and the reference memory cell.

5. The apparatus of claim 1, wherein the current source comprises a pair of transistors coupled together at control gates and a resistance coupled between one of the pair of transistors and ground.

6. The apparatus of claim 1, wherein the chalcogenic semiconductor material of the select device comprises a single phase.

7. The apparatus of claim 6, wherein the single phase is amorphous.

8. The apparatus of claim 1, further comprising:
   a column decoder coupled between the current source and the reference memory cell; and
   a row decoder coupled between the clamp circuit and the second power supply.

9. The apparatus of claim 1, wherein the clamp circuit comprises a metal oxide semiconductor field effect transistor.

10. A memory device comprising:
    a cross-point memory array comprising a plurality of memory cells, each memory cell comprising a memory element and a select device;
    a reference voltage generation apparatus coupled to the cross-point memory array, the apparatus comprising:
      a current source, coupled to a first power supply that supplies a first voltage, the current source configured to supply a first current;
      a reference memory cell coupled to the current source at a reference node, the reference memory cell having a select device comprising a chalcogenic material; and
      a clamp circuit coupled between the reference memory cell and a second power supply voltage configured to supply a second voltage that is less than the first voltage, the clamp circuit configured to control a second current such that when the first current and second current are substantially equal after a transitory response of the apparatus, the reference voltage generated at the reference node tracks a threshold voltage of the select device; and
    a sense circuit coupled to the reference voltage generation apparatus and configured to sense a state of a memory cell based on the reference voltage.

11. The memory device of claim 10, wherein the select device of each memory cell and the select device of the reference memory cell comprise a chalcogenic semiconductor material having a single phase.

12. The memory device of claim 10, wherein the current source comprises a current mirror circuit.

13. The memory device of claim 10, wherein the reference memory cell comprises a memory element of chalcogenic semiconductor material having two metastable phases.

14. The memory device of claim 10, further comprising a controller coupled to the memory array.

15. The memory device of claim 10, wherein the reference memory cell comprises:
    a phase change memory element programmed to a set state; and
    a chalcogenic semiconductor material select device coupled in series with the phase change memory element, the select device fixed in an amorphous phase.

16. The memory device of claim 10, further comprising a capacitor coupled to the reference node.

17. A method for generating a reference voltage, the method comprising:
    pre-charging a bit line to a pre-bias voltage;
    providing a source current to a reference voltage generation circuit to initiate a ramping bit line voltage, wherein the reference voltage generation circuit comprises a reference memory cell having a select device with a phase change material fixed in a single phase;
    maintaining a clamp current as the bit line voltage ramps up and the reference memory cell turns on at a threshold voltage; and
    maintaining an equilibrium between the source current and the clamp current by the reference memory cell to cause the reference voltage to track the threshold voltage of the select device.

18. The method of claim 17, further comprising allowing a word line node to stabilize at the pre-bias voltage after pre-charging the bit line.

19. The method of claim 17, further comprising delivering the reference voltage to a sensing circuit.

20. The method of claim 19, further comprising performing a sensing operation using the reference voltage.

21. The method of claim 19, further comprising compensating the reference voltage for charge sharing losses.

* * * * *